United States Patent
Hou

(10) Patent No.: US 7,683,356 B1
(45) Date of Patent: Mar. 23, 2010

(54) VOLTAGE CONVERTING CIRCUIT

(75) Inventor: Chuan-Tsai Hou, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/274,360

(22) Filed: Nov. 20, 2008

(30) Foreign Application Priority Data

Oct. 8, 2008 (CN) .................... 2008 1 0304780

(51) Int. Cl.
  *G02B 27/00* (2006.01)
  *H02P 7/00* (2006.01)
(52) U.S. Cl. .................... 250/551; 318/268
(58) Field of Classification Search ............. 250/551; 318/268
  See application file for complete search history.

(56) References Cited

U.S. PATENT DOCUMENTS

| | | | | |
|---|---|---|---|---|
| 5,313,150 A * | 5/1994 | Arakawa et al. | .......... | 318/768 |
| 5,631,800 A * | 5/1997 | Jin et al. | .......... | 361/103 |
| 6,320,776 B1 * | 11/2001 | Kajiura et al. | .......... | 363/141 |
| 6,489,757 B2 * | 12/2002 | Ogata et al. | .......... | 250/551 |
| 6,495,932 B1 * | 12/2002 | Yoshimizu et al. | .......... | 307/150 |
| 7,057,363 B2 * | 6/2006 | Ku | .......... | 318/268 |
| 7,148,738 B2 * | 12/2006 | Knoop et al. | .......... | 327/437 |
| 7,181,923 B2 * | 2/2007 | Kurita et al. | .......... | 62/228.4 |
| 7,221,858 B2 * | 5/2007 | Ku | .......... | 318/400.08 |
| 7,228,204 B2 * | 6/2007 | Iino et al. | .......... | 700/300 |
| 7,352,094 B2 * | 4/2008 | Winkler | .......... | 310/89 |
| 7,385,369 B2 * | 6/2008 | Hsieh | .......... | 318/434 |
| 2002/0043967 A1 * | 4/2002 | Ogata et al. | .......... | 323/284 |
| 2003/0065426 A1 * | 4/2003 | Iino et al. | .......... | 700/300 |
| 2003/0182956 A1 * | 10/2003 | Kurita et al. | .......... | 62/228.1 |
| 2004/0084640 A1 * | 5/2004 | Cheyne et al. | .......... | 250/551 |
| 2005/0204760 A1 * | 9/2005 | Kurita et al. | .......... | 62/228.1 |
| 2005/0253744 A1 * | 11/2005 | Kern | .......... | 341/110 |
| 2006/0049786 A1 * | 3/2006 | Ku | .......... | 318/268 |
| 2007/0019934 A1 * | 1/2007 | Ku | .......... | 388/811 |
| 2008/0100239 A1 * | 5/2008 | Hsieh | .......... | 318/268 |

* cited by examiner

*Primary Examiner*—John R Lee
(74) *Attorney, Agent, or Firm*—Zhigang Ma

(57) ABSTRACT

A voltage converting circuit for converting a first voltage signal into a second voltage signal for supplying voltage for an electronic component includes a photoelectric coupler and a connector. The photoelectric coupler includes a light-emitting element and a photosensor. The light-emitting element includes a first terminal configured for receiving the first voltage signal. The photosensor includes a first terminal connected to a power supply, and a second terminal configured for outputting the second voltage signal. The connector configured for connecting the photosensor and the electronic component. When the first voltage signal is at a high level, the light-emitting element emits light to turn on the photosensor, the power supply makes the voltage level of the second voltage signal sent out by the photosensor to satisfy a voltage demand of the electronic component.

10 Claims, 2 Drawing Sheets

VOLTAGE CONVERTING CIRCUIT

BACKGROUND

1. Technical Field

The present disclosure relates to converting circuits, and particularly to a voltage converting circuit.

2. Description of the Related Art

Generally, a voltage converting circuit is connected between a control chip and an electronic component, such as a fan. The voltage converting circuit is configured for converting a low voltage signal, such as a 3V signal that is unfit for the fan, sent out by the control chip to a high voltage signal, such as a 12V signal that is fit for the fan, to meet the voltage demand of the fan. However, the voltage converting circuit generally includes a converting chip and a plurality of transistors, which creates complications and added cost. Furthermore, the voltage converting circuit may distort signals during transmission, which may degrade the fan control circuit's ability to control the fan.

DETAILED DESCRIPTION

Figure 1:
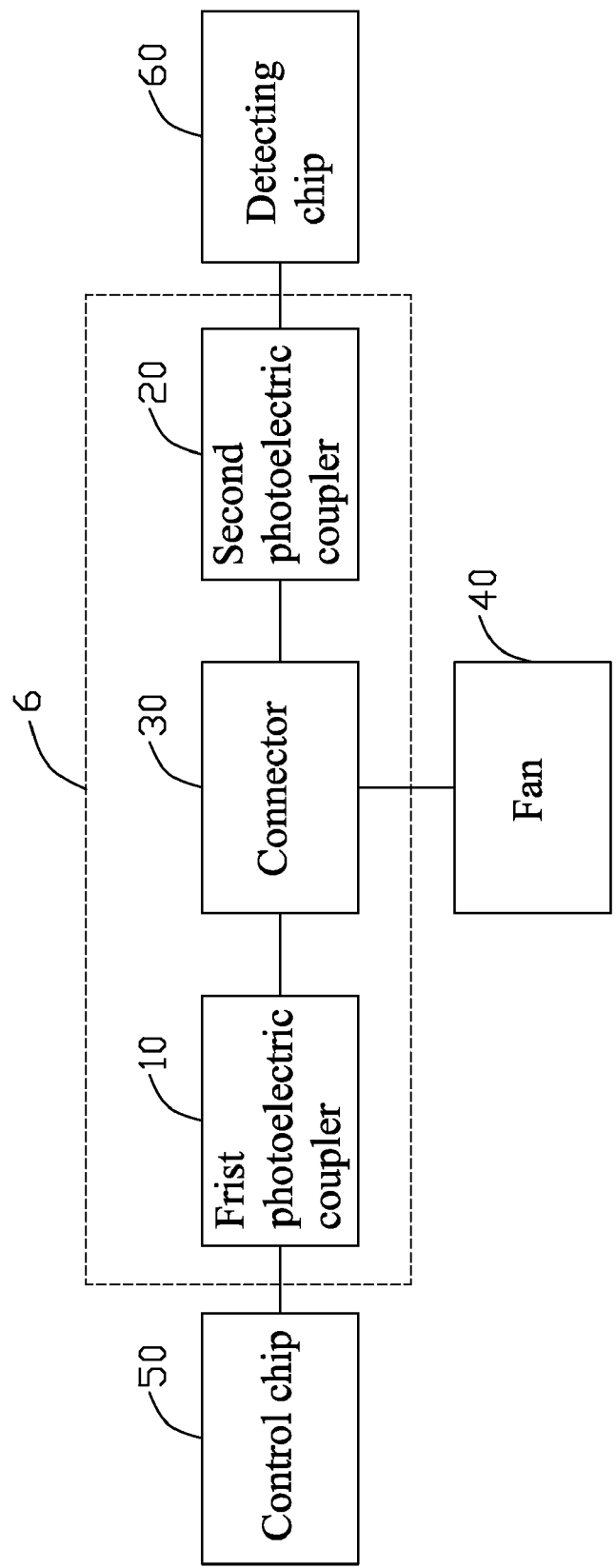
FIG. 1 is a block diagram of an embodiment of a voltage converting circuit, together with a fan, a control chip, and a detecting chip.
Figure 2:
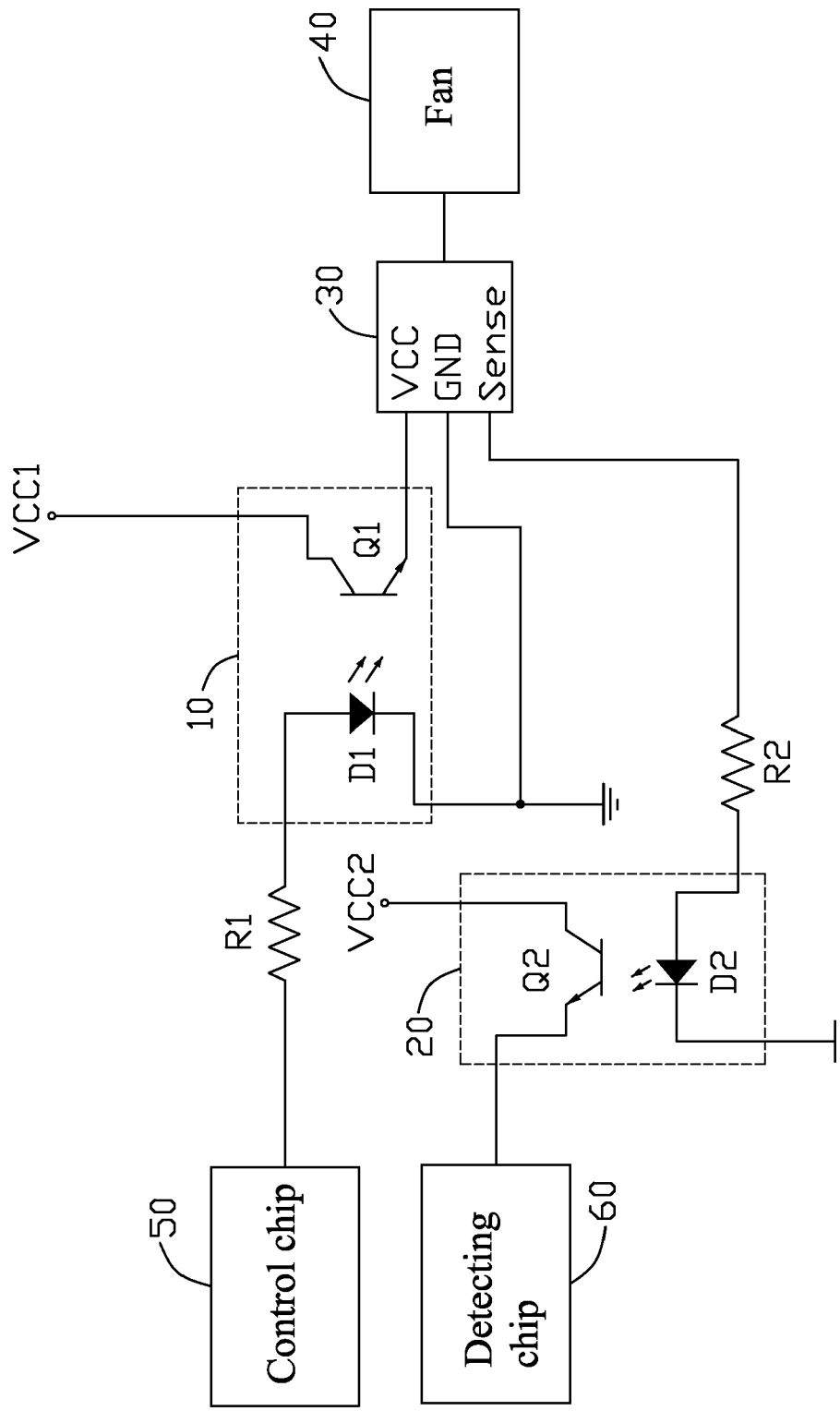
FIG. 2 is a circuit diagram of FIG. 1.

Referring to FIGS. 1 and 2, an embodiment of a voltage converting circuit 6 electronically coupled on a motherboard for converting a voltage supplied for a fan 40, includes a first photoelectric coupler 10, a second photoelectric coupler 20, and a connector 30 configured for connecting to the fan 40. The first photoelectric coupler 10 includes a first light-emitting element, such as a light-emitting diode (LED) D1, and a first photosensor, such as a photoelectric triode Q1. The second photoelectric coupler 20 includes a second light-emitting element, such as an LED D2, and a second photosensor, such as a photoelectric triode Q2. The connector 30, such as a 3-pin fan connector, includes a power pin VCC, a grounded pin GND, and a sensing pin Sense.

The anode of the LED D1 receives a pulse width modulation (PWM) control signal from a control chip 50 of the motherboard via a resistor R1, and the cathode of the LED D1 is connected to the grounded pin GND of the connector 30. The collector of the photoelectric triode Q1 is connected to a first power supply VCC1, such as a 12V power supply. The emitter of the photoelectric triode Q1 is connected to the power pin VCC of the connector 30 to output a PWM signal to the connector 30. The anode of the LED D2 is connected to the sensing pin Sense of the connector 30 via a resistor R2, to receive a sample signal, which is a pulse signal, from the connector 30. The cathode of the LED D2 is grounded. The collector of the photoelectric triode Q2 is connected to a second power supply VCC2, such as a 3V power supply. The emitter of the photoelectric triode Q2 outputs a sensing signal, which is a pulse signal to a detecting chip 60. The duty cycle of the PWM control signal sent out by the control chip 50 can be adjusted, to control the rotation speed of the fan 40.

The duty cycle of the PWM control signal is similar to the duty cycle of the PWM signal, while the voltage level of the PWM control signal is different from the voltage level of the PWM signal. The voltage level of the PWM control signal is an operating voltage of the control chip 50, equal to the voltage of the second power supply VCC2. The voltage level of the PWM signal is equal to the voltage of the first power supply VCC1. The duty cycle of the sample signal is similar to the duty cycle of the sensing signal, while the voltage level of the sample signal is different from the voltage level of the sensing signal. The voltage level of the sample signal is an operating voltage of the fan 40, equal to the voltage of the first power supply VCC1. The voltage level of the sensing signal is equal to the voltage of the second power supply VCC2. In summary, both the voltage levels of the PWM control signal and the sensing signal are equal to the voltage of the first power supply VCC1, and both the voltage levels of the PWM signal and the sample signal are equal to the voltage of the second power supply VCC2.

When the PWM control signal sent out by the control chip 50 is at a high level, such as 3V, the LED D1 turns on. Accordingly, because the LED D1 is turned on, the LED D1 emits light so as to turn on the photoelectric triode Q1. The first power supply VCC1 pulls the voltage level of the PWM signal up to that of the first power supply VCC1 to satisfy the voltage demand of the fan 40. The fan 40 rotates at a speed controlled by the PWM signal. At this time, the sensing pin Sense of the connector 30 sends out the sample signal to the LED D2. When the sample signal is at a high level, such as 12V, the LED D2 turns on to emit light to turn on the photoelectric triode Q2. The second power supply VCC2 pulls the voltage level of the sensing signal down to that of the second power supply VCC2 to satisfy the voltage demand of the detecting chip 60. The detecting chip 60 detects the actual rotation speed of the fan 40 according to the sensing signal to determine whether the fan 40 works normally. In one embodiment, the detecting chip 60 is an ITE8712 detecting chip. It may be appreciated that the LED D1 and the LED D2 may emit light in the visible light spectrum.

The LED D1 is not physically or electrically connected to the photoelectric triode Q1, and the LED D2 is not physically or electrically connected to the photoelectric triode Q2. Therefore, each of the first photoelectric coupler 10 and the second photoelectric coupler 20 has an electrical isolation function, which can avoid the PWM control signal and the sample signal being distorted during the process of converting voltage.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A voltage converting circuit comprising:
   a control chip for outputting a first voltage signal;
   a first photoelectric coupler to convert the first voltage signal into a second voltage signal, wherein the first photoelectric coupler comprises:
      a first light-emitting element comprising a first terminal connected to the control chip to receive the first voltage signal, and a grounded second terminal; and
      a first photosensor comprising a first terminal connected to a first power supply, and a second terminal outputting the second voltage signal to supply voltage to an electronic component;
   a second photoelectric coupler to convert a third voltage signal sent out by the electronic component into a fourth voltage signal for supplying voltage for a detecting chip, wherein the second photoelectric coupler comprises:

a second light-emitting element comprising a first terminal receiving the third voltage signal from the electronic component, and a grounded second terminal; and a second photosensor comprising a first terminal connected to a second power supply, and a second terminal connected to the detecting chip to output the fourth voltage signal to the detecting chip; and a connector connected to the electronic component, wherein the connector comprises a power pin connected to the second terminal of the first photosensor to receive the second voltage signal, a sensing pin connected to the first terminal of the second light-emitting element to output the third voltage signal, and a grounded pin;

wherein the first photosensor is arranged such that a light emitted from the first light-emitting element turns on the first photosensor in response to the first voltage signal being at a high level, and wherein the first power supply adjusts the voltage level of the second voltage signal sent out by the first photosensor to satisfy a voltage demand of the electronic component; and wherein the second photosensor is arranged such that a light emitted from the second light-emitting element turns on the second photosensor in response to the third voltage signal being at a high level, and wherein the second power supply adjusts the voltage level of the fourth voltage signal sent out by the second photosensor to satisfy a voltage demand of the detecting chip.

2. The voltage converting circuit of claim 1, wherein the first and second light-emitting elements are light-emitting diodes, the first terminals of the first and second light-emitting elements are anodes, and the second terminals of the first and second light-emitting elements are cathodes.

3. The voltage converting circuit of claim 1, wherein the first and second photosensors are photoelectric triodes, the first terminals of the first and second photosensors are collectors, and the second terminals of the first and second photosensors are emitters.

4. The voltage converting circuit of claim 1, wherein a resistor is connected between the connector and the second light-emitting element.

5. The voltage converting circuit of claim 1, wherein the fourth voltage signal is a pulse signal, the detecting chip detects whether the electronic component works normally according to the fourth voltage signal.

6. A circuit for a fan, comprising:
a control chip for outputting a first voltage signal;
a detecting chip configured for detecting a rotation speed of the fan;

a first photoelectric coupler comprising a first input connected to the control chip to receive the first voltage signal, a second input connected to a first power supply, and an output, wherein the first voltage signal is capable of controlling the first photoelectric coupler to turn on such that the output outputs a second voltage signal substantially equal to that of the first power supply to the fan;

a second photoelectric coupler comprising a first input receiving a third voltage signal from the fan which indicates actual rotation speed of the fan, a second input connected to a second power supply, and an output, wherein the second voltage signal is capable of controlling the second photoelectric coupler to turn on such that the output of the second photoelectric coupler outputs a fourth voltage signal substantially equal to that of the second power supply to the detecting chip; and a connector connected to the fan, wherein the connector comprises a power pin to receive the second voltage signal from the output of the first photoelectric coupler, a sensing pin to transmit the third voltage signal to the first input of the second photoelectric coupler, and a grounded pin.

7. The circuit of claim 6, wherein the first photoelectric coupler comprises:
a first light-emitting element comprising a first terminal connected to the control chip and a grounded second terminal; and
a first photosensor comprising a first terminal connected to the first power supply and a second terminal connected to the connector.

8. The circuit of claim 7, wherein the second photoelectric coupler comprises:
a second light-emitting element comprising a first terminal connected to the connector and a grounded second terminal; and
a second photosensor comprising a first terminal connected to the second power supply, and a second terminal connected to the detecting chip.

9. The circuit of claim 8, wherein the first and second light-emitting elements are light-emitting diodes, the first terminals of the first and second light-emitting elements are anodes, and the second terminals of the first and second light-emitting elements are cathodes.

10. The circuit of claim 8, wherein the first and second photosensors are photoelectric triodes, the first terminals of the first and second photosensors are collectors, and the second terminals of the first and second photosensors are emitters.

* * * * *